United States Patent
Shin et al.

(10) Patent No.: US 11,654,773 B2
(45) Date of Patent: May 23, 2023

(54) CHARGING CONTROL APPARATUS AND CHARGING CONTROL METHOD FOR ELECTRIC VEHICLE

(71) Applicant: LG INNOTEK CO., LTD., Seoul (KR)

(72) Inventors: Kwang Seob Shin, Seoul (KR); Kyeng Suk Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 293 days.

(21) Appl. No.: 16/968,327

(22) PCT Filed: Feb. 7, 2019

(86) PCT No.: PCT/KR2019/001532
§ 371 (c)(1),
(2) Date: Aug. 7, 2020

(87) PCT Pub. No.: WO2019/156481
PCT Pub. Date: Aug. 15, 2019

(65) Prior Publication Data
US 2021/0094430 A1    Apr. 1, 2021

(30) Foreign Application Priority Data

Feb. 9, 2018  (KR) .................. 10-2018-0016010

(51) Int. Cl.
*B60L 3/00*     (2019.01)
*H02J 7/00*     (2006.01)
(Continued)

(52) U.S. Cl.
CPC ............. *B60L 3/0046* (2013.01); *B60L 53/18* (2019.02); *B60L 53/60* (2019.02); *G01R 31/36* (2013.01);
(Continued)

(58) Field of Classification Search
CPC .. B60L 53/18; B60L 53/60; B60L 3/00; B60L 3/0046; H02J 7/00; H02J 7/0045;
(Continued)

(56) References Cited

U.S. PATENT DOCUMENTS

| 2015/0097525 | A1 | 4/2015 | DeDona et al. |
| 2015/0097526 | A1* | 4/2015 | DeDona ................ B60L 53/16 |
| | | | 320/109 |

(Continued)

FOREIGN PATENT DOCUMENTS

| CN | 205681146 U | * 11/2016 |
| KR | 10-2013-0107759 A | 10/2013 |

(Continued)

*Primary Examiner* — Richard Isla
*Assistant Examiner* — Manuel Hernandez
(74) *Attorney, Agent, or Firm* — Birch, Stewart, Kolasch & Birch, LLP (57) ABSTRACT

An embodiment relates to a charging control apparatus and a charging control method for an electric vehicle. A charging control apparatus according to an embodiment comprises: a proximity detection port to which a proximity signal from a connector of a charging cable is input; a first proximity detection interface for generating a first proximity detection signal on the basis of the proximity signal; a controller for determining whether the connector of the charging cable is in proximity, on the basis of the first proximity detection signal; and a relay disposed between the proximity detection port and the first proximity detection interface and providing a proximity identification signal to the controller on the basis of a control by the controller.

9 Claims, 5 Drawing Sheets

(51) Int. Cl.
   *G01R 31/52* (2020.01)
   *B60L 53/60* (2019.01)
   *B60L 53/18* (2019.01)
   *G01R 31/68* (2020.01)
   *G01R 31/36* (2020.01)
   *G01R 31/69* (2020.01)

(52) U.S. Cl.
   CPC .............. *G01R 31/52* (2020.01); *G01R 31/68* (2020.01); *G01R 31/69* (2020.01); *H02J 7/0045* (2013.01); *H02J 7/0047* (2013.01)

(58) Field of Classification Search
   CPC ....... H02J 7/0047; G01R 31/36; G01R 31/52; G01R 31/68; G01R 31/69
   USPC ........................................................ 320/109
   See application file for complete search history.

(56) References Cited

U.S. PATENT DOCUMENTS

| | | | | |
|---|---|---|---|---|
| 2015/0303737 | A1* | 10/2015 | Steinbuchel, IV | B60L 53/18 320/109 |
| 2016/0082855 | A1* | 3/2016 | Yoshizawa | H02J 13/00002 320/136 |
| 2016/0137082 | A1* | 5/2016 | Jefferies | B60L 53/16 320/109 |

FOREIGN PATENT DOCUMENTS

| | | |
|---|---|---|
| KR | 10-2015-0048812 A | 5/2015 |
| KR | 10-2015-0078419 A | 7/2015 |
| KR | 10-2017-0094869 A | 8/2017 |

* cited by examiner

CHARGING CONTROL APPARATUS AND CHARGING CONTROL METHOD FOR ELECTRIC VEHICLE

CROSS REFERENCE TO RELATED APPLICATIONS

This application is the National Phase of PCT/KR2019/001532 filed on Feb. 7, 2019, which claims priority under 35 U.S.C. § 119(a) to Patent Application No. 10-2018-0016010 filed in the Republic of Korea on Feb. 9, 2018, all of which are hereby expressly incorporated by reference into the present application.

TECHNICAL FIELD

The embodiment relates to a charging control apparatus and a charging control method for an electric vehicle.

BACKGROUND ART

Eco-friendly vehicles, such as an electric vehicle (EV) or a plug-in hybrid electric vehicle (PHEV), use an electric vehicle supply equipment (EVSE) installed at a supply to charge a battery. To this end, an electric vehicle charging controller (EVCC) is mounted in the EV, communicates with the EV and the EVSE, and controls charging of the EV.

For example, when the EV receives a proximity detection signal from the EVSE and determines that a charging cable is in proximity, the EV may determine whether to perform charging. In addition, the EV determines whether or not the battery is short-circuited before starting charging, and may charge the battery when a battery short-circuit error does not occur.

However, the EV has a problem that it is difficult to determine what kind of error it is because symptoms caused by the battery short-circuit error and a charging cable non-proximity error are similar. When the EV may determine whether it is the battery short-circuit error or the charging cable non-proximity error, it is possible to accurately determine an error that the battery is not charged, and take appropriate measures according to the error to quickly and economically charge the battery.

SUMMARY

An embodiment has been devised to solve problems of the related art described above, and an object of the embodiment is to provide a charging control apparatus and a charging control method for an electric vehicle.

In addition, the embodiment provides a charging control apparatus and a charging control method for an electric vehicle capable of accurately determining whether a charging cable is connected.

In addition, the embodiment provides a charging control apparatus and a charging control method for an electric vehicle capable of accurately determining whether a battery is short-circuited.

In addition, the embodiment provides a charging control apparatus and a charging control method for an electric vehicle capable of accurately determining a battery charging error to take appropriate measures according to the error.

A charging control apparatus according to an embodiment includes: a proximity detection port to which a proximity signal is input from a connector of a charging cable; a first proximity detection interface for generating a first proximity detection signal based on the proximity signal; a controller determining whether the connector of the charging cable is in proximity based on the first proximity detection signal; and a relay disposed between the proximity detection port and the first proximity detection interface and providing the proximity identification signal to the controller based on a control by the controller.

In addition, the controller allows the relay to provide the proximity identification signal when it is determined that the connector of the charging cable is not in proximity based on the first proximity detection signal.

In addition, the controller determines that a battery is short-circuited when the proximity identification signal is input after determining that the connector of the charging cable is not in proximity.

In addition, the charging control apparatus further includes a second proximity detection interface for generating a second proximity detection signal based on the proximity signal, and the controller determines whether the connector of the charging cable is in proximity based on the first proximity detection signal or the second proximity detection signal.

In addition, the controller allows the relay to provide the proximity identification signal when it is determined that the connector of the charging cable is not in proximity based on the first proximity detection signal or the second proximity detection signal.

In addition, the controller determines that a battery is short-circuited when the proximity identification signal is input after determining that the connector of the charging cable is not in proximity.

In addition, the first proximity detection interface includes a first switch to which the first proximity detection signal is input, the second proximity detection interface includes a second switch to which the first proximity detection signal is input, and the controller turns off the first switch and the second switch and allows the relay to provide the proximity identification signal when it is determined that the connector of the charging cable is not in proximity.

In addition, the first proximity detection interface includes an opto-coupler.

In addition, the relay includes a relay switch turned on or off by the controller.

Meanwhile, in a charging control method of a charging control apparatus of an electric vehicle including a controller for controlling charging of a battery, the charging control method of the charging control apparatus according to an embodiment includes: inputting a proximity signal; generating a first proximity detection signal based on the proximity signal; determining whether the charging cable is connected based on the first proximity detection signal; and directly inputting the proximity identification signal to the controller when it is determined that the charging cable is not connected.

In addition, the charging control method further includes determining a battery short-circuit based on the proximity identification signal.

Advantageous Effects

Effects of a charging control apparatus and a charging control method for an electric vehicle according to an embodiment will be described as follows.

In addition, the embodiment may accurately determine whether a charging cable is connected.

In addition, the embodiment may accurately determine whether a battery is short-circuited.

In addition, the embodiment may accurately determine a battery charging error to take appropriate measures according to the error.

In addition, the embodiment may save time and cost because it is possible to take appropriate measures according to the battery charging error.

The effects expected in the embodiment are not limited to the above-mentioned effects, and other effects not mentioned will be clearly understood by a person having an ordinary skill in the art to which the embodiment pertains, from the following descriptions.

BRIEF DESCRIPTION OF THE DRAWINGS

The accompanying drawings are to help understanding of the embodiment, and provide embodiments of the embodiment in conjunction with the detailed description. However, the technical features of the embodiment are not limited to specific drawings, and features disclosed in the drawings may combine with each other to form a new embodiment.

DETAILED DESCRIPTION

Hereinafter, embodiments related to the present invention will be described in detail with reference to the accompanying drawings. The component suffixes "module" and "part" used in the following description are given or mixed together only considering the ease of creating the specification, and have no meanings or roles that are distinguished from each other by themselves.

Advantages and features of the present invention, and methods for achieving them will be apparent with reference to the embodiments described below in detail with reference to the accompanying drawings. However, the present invention is not limited to the embodiments disclosed below, but may be implemented in various forms, and only the embodiments of the present invention make the disclosure of the present invention complete, and are provided to fully convey the scope of the present invention to those skilled in the art to which the present invention belongs, and the present invention is defined only by the scope of the claims. Like reference numerals refer to like elements throughout the specification.

In describing the embodiments of the present invention, when it is determined that a detailed description of a well-known function or a configuration may unnecessarily obscure the gist of the present invention, the detailed description thereof will be omitted. Terms to be described below are terms defined in consideration of functions in the embodiments of the present invention, and may vary according to intentions or customs of users or operators. Therefore, the definition should be made based on the contents throughout the present specification.

Combinations of each block in the accompanying drawings and each step of the flowchart may be performed by computer program instructions. These computer program instructions may be mounted on a processor of a general purpose computer, a special purpose computer, or other programmable data processing equipment, and thus the instructions performed by the processor of the computer or other programmable data processing equipment create means for performing the functions described in each block of the drawing or each step of the flowchart. These computer program instructions may also be stored in a computer usable or computer readable memory capable of directing the computer or other programmable data processing equipment to implement a function in a particular manner, and thus the instructions stored in the computer usable or computer readable memory may also produce a manufactured item containing instruction means for performing the functions described in each block of the drawings or each step of the flowchart. The computer program instructions may also be mounted on the computer or other programmable data processing equipment, and thus the instructions for performing the computer or other programmable data processing equipment by performing a series of operating steps on the computer or other programmable data processing equipment to create a computer-implemented process, may also provide steps for performing the functions described in each block of the drawings and each step of the flowchart.

In addition, each block or each step may represent a module, segment or a portion of code that includes one or more executable instructions for performing specified logical function(s). It should also be noted that in some alternative embodiments, the functions noted in the blocks or steps may occur out of order. For example, two blocks or steps shown in succession may be performed substantially simultaneously, or the blocks or steps may sometimes be performed in reverse order depending on the corresponding function.

Figure 1:
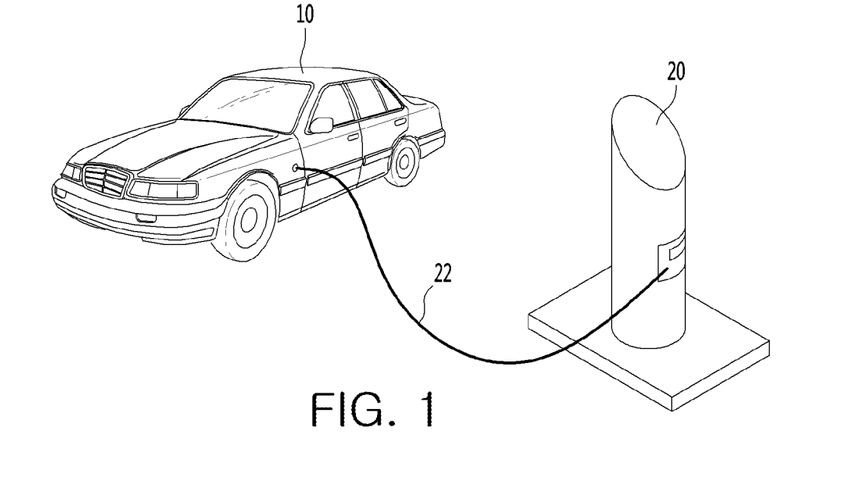
FIGS. 1 to 3 are views showing a charging system of an electric vehicle according to an embodiment.
Figure 2:
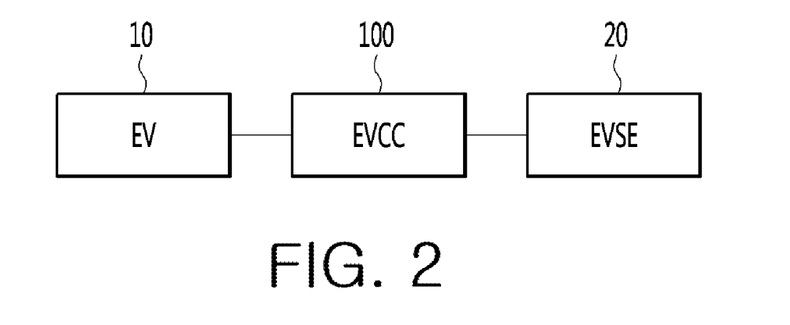
Figure 3:
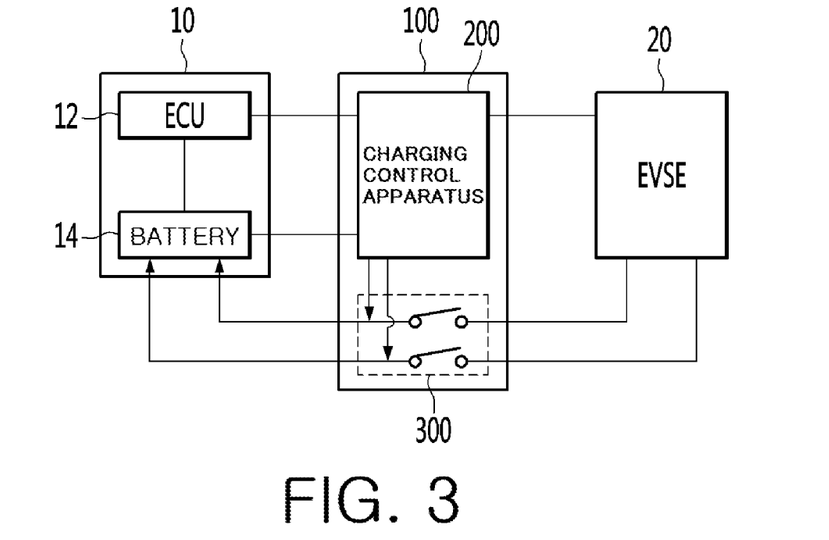

FIGS. 1 to 3 are views showing a charging system of an electric vehicle according to an embodiment. Referring to FIGS. 1 to 3, an electric vehicle (EV) 10 may be charged by an electric vehicle supply equipment (EVSE) 20. To this end, a charging cable 22 connected to the EVSE 20 may be connected to an oil inlet port of the EV 10. Here, the EVSE 20 is an apparatus that supplies an alternating current (AC) or direct current (DC), and may be disposed at a supply or home, or may also be portably implemented. The EVSE 20 may also be referred to as a supply, an AC supply, a DC supply, a socket-outlet, or the like.

An electric vehicle charging controller (EVCC) 100 is mounted in the EV 10 and connected to the EV 10. For example, the EVCC 100 may be installed in a trunk of the EV 10, but is not limited thereto. Here, the EVCC 100 may communicate with the EV 10 and the EVSE 20, respectively. According to the embodiment, the EVCC 100 includes a charging control apparatus 200 and a power supply unit 300.

The charging control apparatus 200 is connected to the EV 10 and the EVSE 20, respectively. The charging control apparatus 200 may be connected to the EV 10 and the EVSE 20 through a plurality of pins, respectively.

For example, the charging control apparatus 200 may include 20 pins connected to the EVSE 20, and may communicate with the EVSE 20 through the 20 pins. For example, one among the 20 pins may be a pin for a control pilot (CP) port for receiving a CP signal from the EVSE 20, another one may be a pin for a proximity detection (PD) port for detecting whether a connector of the charging cable is in proximity, still another one may be a pin for a charge sequence (CS) port for receiving a CS signal from the EVSE 20, and still another one is may be a pin for a protective earth (PE) port connected to a ground of the EVSE 20. Another one among the 20 pins may be a pin for driving a motor to open a flap of an inlet port, still another one may be a pin for sensing the motor, still another one may be a pin for sensing a temperature, still another one may be a pin for sensing a light-emitting diode (LED), and still another one may be a pin for controller area network (CAN) communication. However, a number and function of the pins are not limited thereto, and may be variously modified.

In addition, the charging control apparatus 200 may include 12 pins connected to the EV 10, and may communicate with the EV 10 through the 12 pins. For example, one among the 12 pins may be a pin for a voltage line applied from a collision detection sensor in the EV 10, another one may be a battery pin in the EV 10, still another one may be a pin for CAN communication, still another one may be a pin connected to a ground, and still another one may be a pin for high voltage protection. However, a number and function of the pins are not limited thereto, and may be variously modified.

Two high voltage lines of the EVSE 20 supply power to a battery 14 of the EV 10 by the power supply unit 300 of the EVCC 100, and at this time, turn-on and turn-off of the high voltage lines may be controlled by the charging control apparatus 200.

That is, the charging control apparatus 200 may communicate with an electric controller (ECU) 12 of the EV 10, and may control the power supply unit 300 that transmits the power supplied from the EVSE 20 to the battery 12 of the EV 10 according to signals received from the EV 10 and the EVSE 20, respectively.

Figure 4:
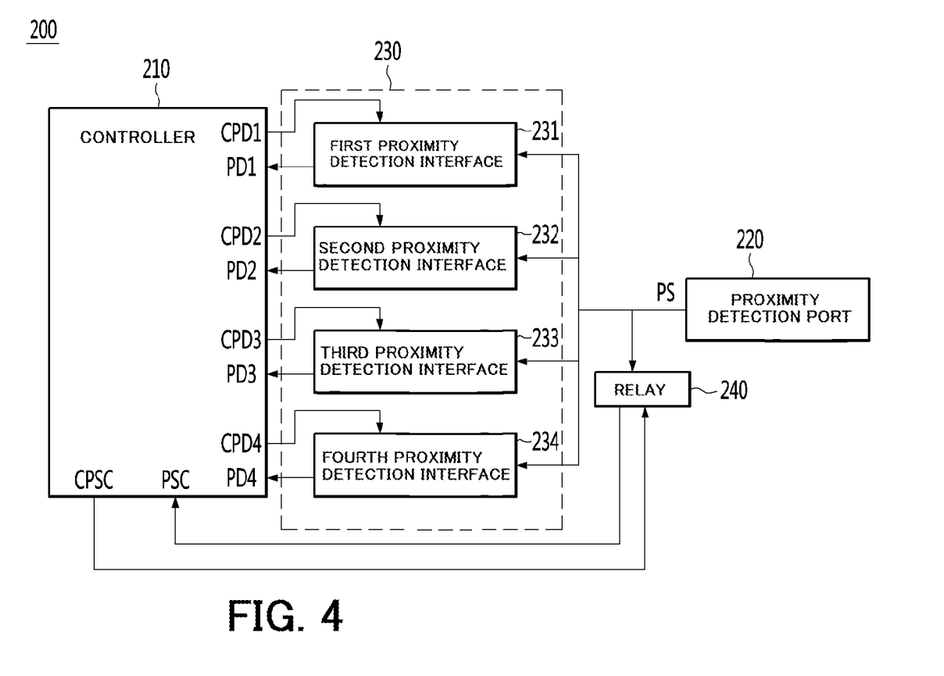
FIG. 4 is a block diagram of a charging control apparatus according to one embodiment.
Figure 5:
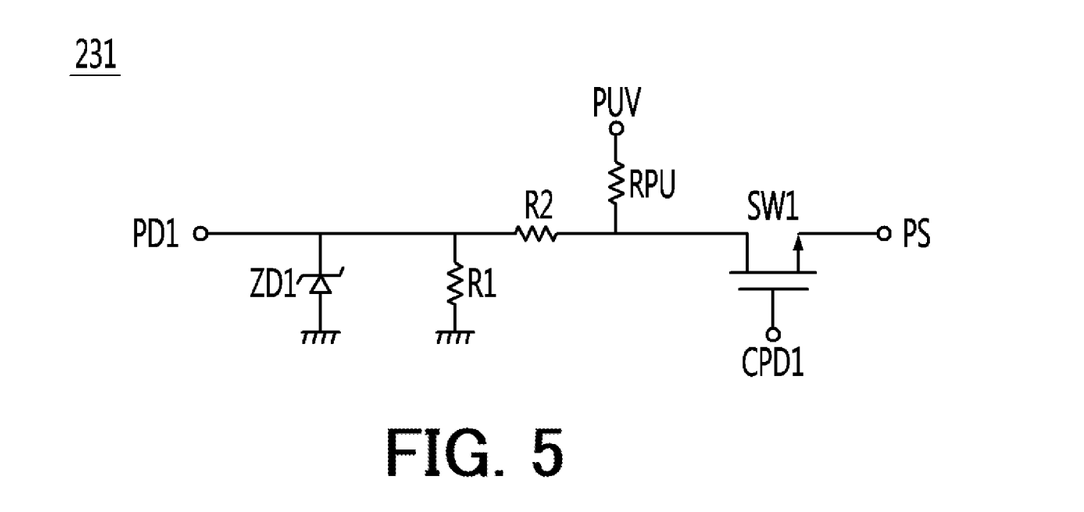
FIG. 5 is a circuit diagram of a first proximity detection interface of FIG. 4.
Figure 6:
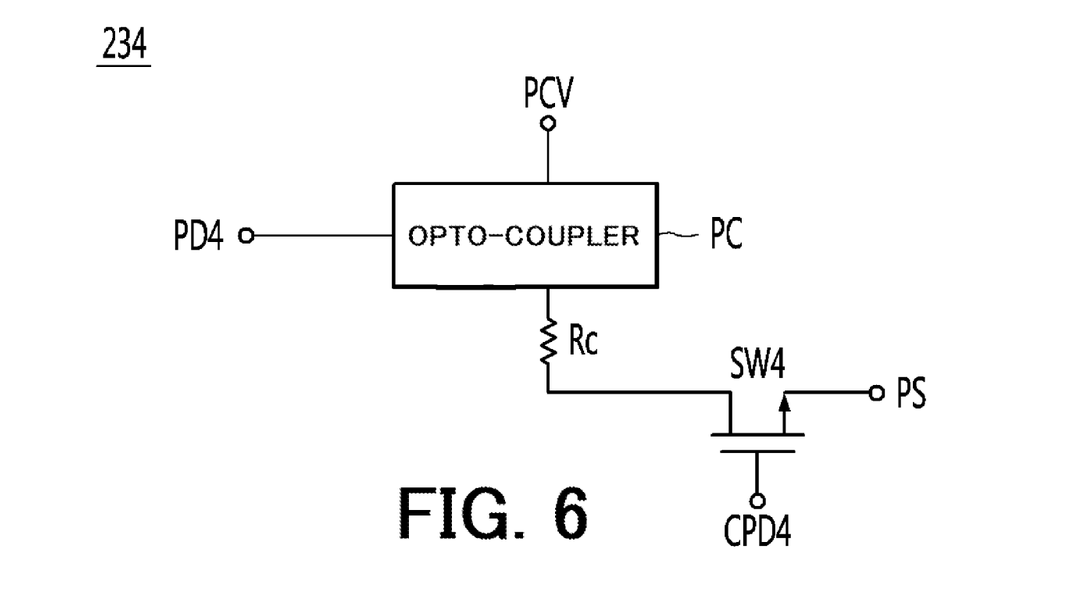
FIG. 6 is a circuit diagram of a fourth proximity detection interface of FIG. 4.
Figure 7:
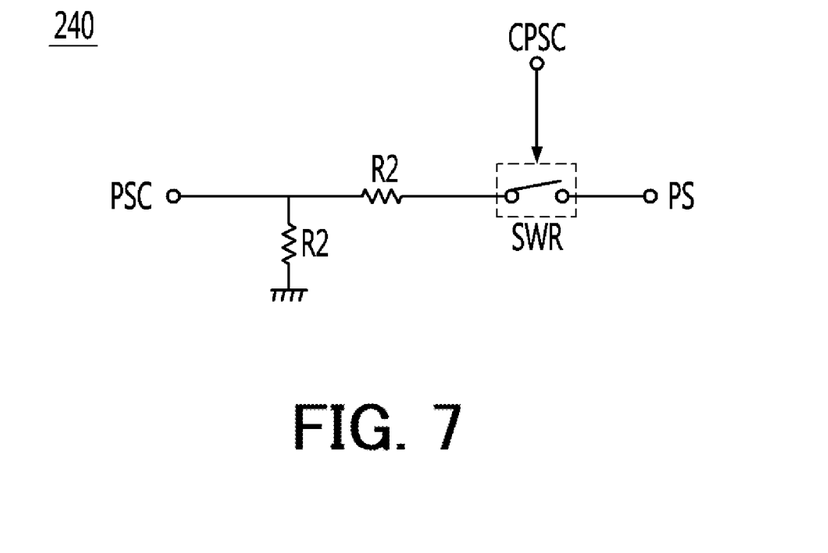
FIG. 7 is a circuit diagram of a relay of FIG. 4.

FIG. 4 is a block diagram of a charging control apparatus according to one embodiment, FIG. 5 is a circuit diagram of a first proximity detection interface of FIG. 4, FIG. 6 is a circuit diagram of a fourth proximity detection interface of FIG. 4, and FIG. 7 is a circuit diagram of a relay of FIG. 4.

Referring to FIG. 4, a charging control apparatus 200 according to one embodiment may include a controller 210. In the present specification, the controller 210 may also be referred to as a microcontroller (MCU), a controller, and a controller. Here, the MCU may refer to a computer in which a microprocessor and input and output modules are integrated in one chip to perform a predetermined function. When the MCU is applied in a vehicle, it may be implemented as a device such as an electronic controller (ECU), and an automobile engine, an automatic transmission, and various parts of an anti-lock braking system (ABS) may be controlled by the computer. The MCU according to one embodiment may be applied in the charging control apparatus 200 for charging the EV. The MCU applied in the charging control apparatus 200 may control overall charging of the EV.

The controller 210 may determine whether there is a charging error for charging a battery 14. When the charging error occurs, the controller 210 may not start or stop a charging process of the battery 140. The charging error may include a battery short-circuit, a charging cable disconnection, a ground short-circuit, and the like. More specifically, the controller 210 may determine whether a connector of the charging cable is in proximity based on a proximity detection signal PD. The proximity detection signal PD may be provided from a proximity detection interface unit 230.

As an example, when the proximity detection signal PD is equal to or higher than a predetermined voltage level, the controller 210 may determine that the charging cable is in proximity, that is, the charging cable is connected. When the proximity detection signal PD is less than the predetermined voltage level, the controller 210 may determine that the charging cable is not in proximity, that is, the charging cable is not connected.

The controller 210 may control the proximity detection interface unit 230. That is, the controller 210 may provide a proximity detection control signal CPD to drive or stop the proximity detection interface unit 230. For example, the proximity detection control signal CPD may turn on/off a switch. When the proximity detection interface unit 230 includes a plurality of proximity detection interfaces, the controller 210 may drive only one proximity detection interface of the plurality of proximity detection interfaces, and may not drive the other proximity detection interfaces.

For example, the proximity detection interface unit 230 may include first to fourth proximity detection interfaces 231 to 234, and the controller 210 may drive only the first proximity detection interface 231, and may not drive the second to fourth proximity detection interfaces 231 to 234. To this end, the controller 210 may provide the proximity detection control signal CPD to be driven in a selected proximity detection interface, and may provide a proximity detection control signal CPD to be not driven in a non-selected proximity detection interface.

For example, the controller 210 may provide a first proximity detection control signal CPD1 for driving the first proximity detection interface 231, and may provide second to fourth proximity detection control signals CPD2 to CPD4 that prevent the second to fourth proximity detection interfaces 232 to 234 from being driven, respectively. Thereafter, the controller 210 receives the proximity detection signal PD from a proximity detection interface which is driven, and may determine whether the charging cable is in proximity, that is, whether the charging cable is connected, based on the received proximity detection signal PD. For example, the controller 210 receives a first proximity detection signal PD1 from the first proximity detection interface 231 which is driven, and may determine whether the charging cable is in proximity, that is, whether the charging cable is connected, based on the received first proximity detection signal PD1. Any one of the plurality of proximity detection interfaces of the controller 210 may be selected according to a standard of the EVSE 20. As an example, the standard of the EVSE 20 may include a North American standard, a European standard, a Chinese standard, a Japanese standard, and the like.

In addition, the controller 210 may be provided with a proximity identification signal PSC when it is determined that the connector of the charging cable is not in proximity, that is, that the charging cable is not connected, based on the proximity detection signal PD. That is, even though the controller 210 determines whether the connector of the charging cable is in proximity based on the proximity detection signal PD, the controller 210 may confirm again whether a charging error is caused by another reason.

More specifically, the controller 210 determines whether the battery is short-circuited based on the proximity identification signal PSC when it is determined that the connector of the charging cable is not in proximity, that is, the charging cable is not connected, based on the proximity detection signal PD. More specifically, the controller 210 may determine whether the connector of the charging cable is in proximity based on the proximity detection signal PD.

The proximity detection identification signal PSC may be provided from a relay 240. As an example, the controller 210 may determine that the battery is short-circuited when the proximity detection identification signal PSC is equal to or higher than a predetermined voltage level. That is, when the proximity detection identification signal PSC is equal to or higher than the predetermined voltage level, the controller 210 may erroneously determine that it is a non-connection error even though the charging cable is in proximity or is connected, and thus may determine that it is a battery short-circuit error.

When the proximity detection identification signal PSC is less than the predetermined voltage level, the controller 210 may finally determine that the charging cable is not in proximity, that is, the charging cable is not connected. In addition, the controller 210 may provide the proximity detection control signal CPD to stop driving of the proximity detection interface unit 230 in order to receive the proximity identification signal PSC, and may provide a proximity identification control signal CPSC to drive the relay 240. For example, the controller 210 may provide the first to fourth proximity detection control signals CPD1 to CPD4 for stopping driving in response to the first to fourth proximity detection interfaces 231 to 234, respectively, and may provide the proximity identification control signal CPSC for driving the relay 240. In addition, the proximity identification control signal CPSC may be a switch on/off signal.

The charging control apparatus 200 according to one embodiment may include a proximity detection port 220. The proximity detection port 220 may receive a proximity signal PS from the charging cable. In addition, the proximity detection port 220 may provide the input proximity signal PS to the interface unit 230. As an example, when the interface unit 230 includes the first to fourth proximity detection interfaces 231 to 234, the proximity detection port 220 may provide the proximity signal PS to the first to fourth proximity detection interfaces 231 to 234. In addition, the proximity detection port 220 may provide the proximity signal PS to the relay 240.

The charging control apparatus 200 according to one embodiment may include the proximity detection interface unit 230. The proximity detection interface unit 230 may provide the proximity detection signal PD capable of determining whether there is a charging cable proximity error based on the proximity signal PS provided by the proximity detection port 220 to the controller 210. That is, the proximity detection interface unit 230 may provide the proximity signal PS directly as the proximity detection signal PD, or may change a level of the proximity signal PS to provide as the proximity detection signal PD. The proximity detection interface unit 230 may include one or more proximity detection interfaces.

More specifically, the proximity detection interface unit 230 may include the first to fourth proximity detection interfaces 231 to 234. The proximity detection interface of the proximity detection interface unit 230 may comply with the standard of the EVSE 20. As an example, the first proximity detection interface 231 may comply with the North American standard. The second proximity detection interface 232 may be the European standard. The third proximity detection interface 233 may be the Chinese standard. The fourth proximity detection interface 234 may be the Japanese standard.

That is, a configuration of the proximity detection interface and a numerical value of the corresponding configuration may be different for each standard. For example, referring to FIG. 5, it may be a circuit diagram of the first proximity detection interface 231, but the embodiment is not limited thereto. The first proximity detection interface 231 may include a first zener diode ZD1, a first resistor R1, a second resistor R2, a pull-up resistor RPU, and a first switch SW1. The first switch 51 may receive the proximity signal PS and output the proximity signal PS according to the control of the first proximity detection control signal CPD1 provided from the controller 210.

The pull-up resistor RPU may receive a pull-up voltage PUV provided from the battery 14 and provide the pull-up voltage PUV to the second resistor R2 at all times. The first resistor R1 and the second resistor R2 may be distribution resistors. The first resistor R1 and the second resistor R2 may voltage-divide the pull-up voltage PUV to provide it to the first zener diode ZD1 when the proximity signal PS is not provided, and may voltage-divide the proximity signal PS to provide it to the first zener diode ZD1 when the proximity signal PS is provided.

The first zener diode ZD1 may prevent the provided pull-up voltage PUV or the proximity signal PS from exceeding the predetermined voltage level to prevent overvoltage from being input to the controller 210. The first zener diode ZD1 may provide the voltage-divided proximity signal PS to the controller 210 as a first proximity detection signal PD1. The second and third proximity detection interfaces 232 and 233 have the same configuration and the same structure as the first proximity detection interface 231, but a resistance value or a limit voltage value of the corresponding configuration may be different, but the embodiment is not limited thereto, and the configuration and structure thereof may be different from the first proximity detection interface 231.

As another example, referring to FIG. 6, the fourth proximity detection interface 234 may include an optocoupler PC, a coupler resistor Rc, and a fourth switch. A fourth switch S4 may receive the proximity signal PS and output the proximity signal PS according to the control of the fourth proximity detection control signal CPD4 provided by the controller 120. The coupler resistor Rc may provide the proximity signal PS provided from the fourth switch S4 to the opto-coupler PC.

The opto-coupler PC may operate based on an optocoupler driving voltage PCV provided from the battery 14. The opto-coupler PC may also be referred to as a photo coupler. The opto-coupler PC includes a light-emitting diode and a photo transistor, and when a current is applied to the light-emitting diode, the light-emitting diode emits light. The photo transistor may be in a conductive state by receiving light emitted from the light-emitting diode. Using this principle, when the proximity signal PS is detected, the opto-coupler PC may provide the fourth proximity detection signal PD4 to the controller 210.

The charging control apparatus 200 according to one embodiment may include the relay 240. The relay 240 may provide the proximity detection identification signal PSC capable of determining whether there is a charging cable proximity error based on the proximity signal PS provided by the proximity detection port 220 to the controller 210.

That is, the relay 240 may directly provide the proximity signal PS as the proximity detection identification signal PSC, or may change a level of the proximity signal PS to provide as the proximity detection identification signal PSC. The relay 240 may include a relay switch. The relay 240 may be driven according to the control of the controller 210.

For example, referring to FIG. 7, the relay 240 may include a relay switch SWR, a first relay resistor RR1, and a second relay resistor RR2. The relay switch SWR may receive the proximity signal PS and output the proximity signal PS according to the proximity identification control signal CPSC provided from the controller 210. The first relay resistor RR1 and the second relay resistor RR2 may be distribution resistors. The first relay resistor RR1 and the second relay resistor RR2 may provide the proximity identification signal PSC obtained by voltage-dividing the proximity signal PS to the controller 210 when the proximity signal PS is provided.

Therefore, the embodiment may accurately determine whether the charging cable is connected. In addition, the embodiment may accurately determine whether the battery is short-circuited. In addition, the embodiment may accurately determine a battery charging error to take appropriate measures according to the error. In addition, the embodiment may save time and cost because it is possible to take appropriate measures according to the battery charging error.

Figure 8:
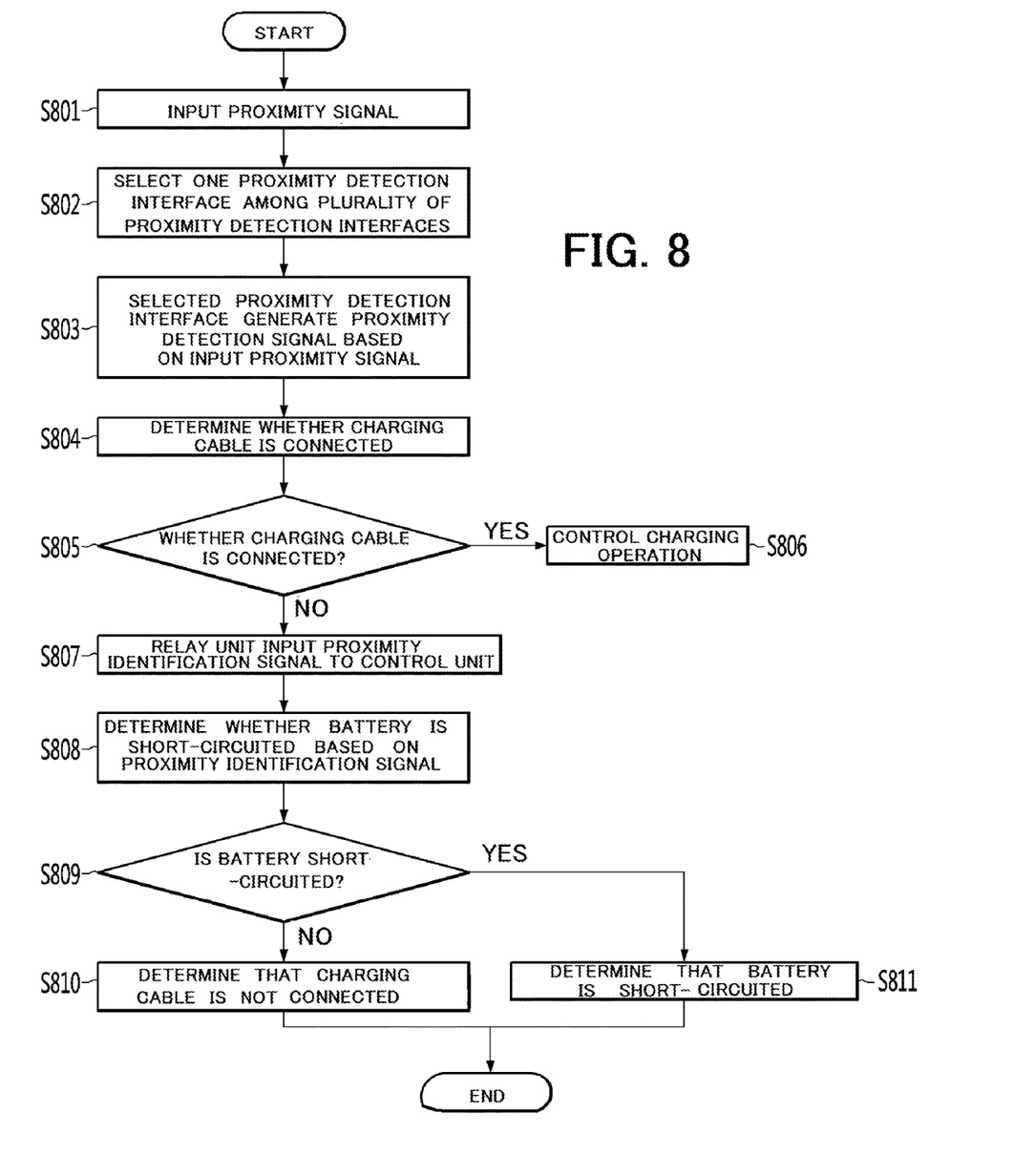
FIG. 8 is a flowchart according to a charging control method of a charging control apparatus according to one embodiment.

FIG. 8 is a flowchart according to a charging control method of a charging control apparatus according to one embodiment. Referring to FIG. 8, the charging control method according to one embodiment may include receiving a proximity signal (S8010). That is, the charging control apparatus may receive the proximity signal via a connector of a charging cable.

The charging control method according to one embodiment may include selecting one proximity detection interface among a plurality of proximity detection interfaces (S802). A controller may select the proximity detection interface according to a standard of an electric vehicle supply equipment.

The charging control method according to one embodiment may include generating a proximity detection signal based on the proximity signal input by the selected proximity detection interface (S803). That is, the proximity detection interface may directly provide the proximity signal as the proximity detection signal, or may change a level of the proximity signal to provide as the proximity detection signal.

The charging control method according to one embodiment may include determining whether a charging cable is connected (S804 and S805). As an example, when the proximity detection signal is equal to or higher than a predetermined voltage level, the controller may determine that the charging cable is in proximity, that is, the charging cable is connected. When it is determined that the charging cable is connected, the charging control apparatus may control a charging operation (S806).

The charging control method according to one embodiment may include inputting a proximity identification signal to the controller by a relay when it is determined that the charging cable is not connected (S807). The charging control method according to one embodiment may include determining whether a battery is short-circuited based on the proximity identification signal (S808 and S809).

As an example, the controller may determine that the battery is short-circuited when the proximity detection identification signal is equal to or higher than a predetermined voltage level. That is, when the proximity detection identification signal is equal to or higher than the predetermined voltage level, the controller may erroneously determine that it is a non-connection error even though the charging cable is in proximity or is connected, and thus may determine that it is a battery short-circuit error.

When it is determined that the battery is not short-circuited, the charging control apparatus may determine that the charging cable is not connected (S810). When it is determined that the battery is short-circuited, the charging control apparatus may determine a charging error as the battery short-circuit (S811).

According to one embodiment, the above-described method may be implemented as a processor readable code in a medium in which a program is recorded. Examples of a processor readable medium include a ROM, a RAM, a CD-ROM, a magnetic tape, a floppy disk, an optical data storage system, and the like, and include what is implemented in the form of carrier waves (for example, transmission through the Internet).

The embodiments described as above are not applicable to be limited to the configurations and methods described, and the embodiments may be configured by selectively combining all or some of the embodiments so that various modifications may be made.

In addition, preferred embodiments of the present invention are shown and described above, but the present invention is not limited to the specific embodiments described above, of course, various modifications may be made by those skilled in the art to which the invention belongs without departing from the gist of the present invention claimed in the claims, and such modifications should not be individually understood from the technological scope or the prospect of the present invention.

The invention claimed is:

1. A charging control apparatus comprising:
    a proximity detection port to which a proximity signal is input from a connector of a charging cable;
    a first proximity detection interface configured to generate a first proximity detection signal based on the proximity signal;
    a relay disposed between the proximity detection port and the first proximity detection interface; and
    a controller configured to:
    determine the charging cable is connected to the connector of the proximity detection port and start a charging operation when the first proximity detection signal is greater than or equal to a predetermined voltage level, and
    determine the charging cable is not connected to the connector of the proximity detection port when the first proximity detection signal is less than the predetermined voltage level,
    wherein when the controller determines the charging cable is not connected, the controller is further configured to:
    control the relay to directly relay the proximity signal to the controller,
    determine a battery is short-circuited when the relayed proximity signal is greater than or equal to the predetermined voltage level, and
    determine the charging cable is not connected to the connector of the proximity detection portion when the relayed proximity signal is less than the predetermined voltage level.

2. The charging control apparatus of claim 1, further comprising
    a second proximity detection interface configured to generate a second proximity detection signal based on the proximity signal,
    wherein the controller is further configured to determine whether the charging cable is connected to the connector of the proximity detection port based on the first proximity detection signal or the second proximity detection signal.

3. The charging control apparatus of claim 2, wherein the first proximity detection interface includes a first switch to which the first proximity detection signal is input,
    wherein the second proximity detection interface includes a second switch to which the first proximity detection signal is input, and wherein the controller is further configured to turn off the first switch and the second switch and control the relay to relay the proximity signal when the charging cable is determined not be connected to the connector of the proximity detection port.

4. The charging control apparatus of claim 1, wherein the first proximity detection interface includes an opto-coupler.

5. A charging control apparatus comprising:
a proximity detection port to which a proximity signal is input from a connector of a charging cable;
a first proximity detection interface configured to generate a first proximity detection signal based on the proximity signal;
a controller configured to determine whether the connector of the charging cable is in proximity based on the first proximity detection signal;
a relay disposed between the proximity detection port and the first proximity detection interface and configured to provide the proximity identification signal to the controller based on a control by the controller; and
a second proximity detection interface configured to generate a second proximity detection signal based on the proximity signal,
wherein the controller is further configured to determine whether the connector of the charging cable is in proximity based on the first proximity detection signal or the second proximity detection signal,
wherein the controller is further configured to allow the relay to provide the proximity identification signal when it is determined that the connector of the charging cable is not in proximity based on the first proximity detection signal or the second proximity detection signal,
wherein the first proximity detection interface includes a first switch to which the first proximity detection signal is input,
wherein the second proximity detection interface includes a second switch to which the first proximity detection signal is input, and
wherein the controller is further configured to turn off the first switch and the second switch and allows the relay to provide the proximity identification signal when it is determined that the connector of the charging cable is not in proximity.

6. A charging control method of a charging control apparatus of an electric vehicle including a controller for controlling charging of a battery, the method comprising:
inputting a proximity signal to a proximity detection port input from a connector of a charging cable;
generating, via a first proximity detection interface, a first proximity detection signal based on the proximity signal;
selectively relaying, via a relay disposed between the proximity detection port and the first proximity detection interface, the proximity signal to the controller;
determining, via the controller, the charging cable is connected to the connector of the proximity detection port and starting a charging operation when the first proximity detection signal is greater than or equal to a predetermined voltage level; and
determining, via the controller, the charging cable is not connected to the connector of the proximity detection portion when the first proximity detection signal is less than the predetermined voltage level,
wherein when the charging cable is determined not to be connected, the method further comprises:
controlling, via the controller, the relay to directly relay the proximity signal to the controller;
determining a battery is short-circuited when the relayed proximity signal is greater than or equal to the predetermined voltage level; and
determining the charging cable is not connected to the connector of the proximity detection portion when the relayed proximity signal is less than the predetermined voltage level.

7. The method of claim 6, further comprising
generating, via a second proximity detection interface, a second proximity detection signal based on the proximity signal; and
determining, via the controller, whether the charging cable is connected to the connector of the proximity detection port based on the first proximity detection signal or the second proximity detection signal.

8. The method of claim 7, wherein the first proximity detection interface includes a first switch to which the first proximity detection signal is input,
wherein the second proximity detection interface includes a second switch to which the first proximity detection signal is input, and
wherein the method further comprises turning off the first switch and the second switch and controlling the relay to relay the proximity signal when the charging cable is determined not be connected to the connector of the proximity detection port.

9. The method of claim 6, wherein the first proximity detection interface includes an opto-coupler.

* * * * *